United States Patent [19]

Murphy et al.

[11] Patent Number: 5,702,255

[45] Date of Patent: Dec. 30, 1997

[54] BALL GRID ARRAY SOCKET ASSEMBLY

[75] Inventors: James V. Murphy, Warwick; Michael J. Murphy, East Greenwich; Burton Fisher; Robert Taylor, both of Coventry, all of R.I.

[73] Assignee: Advanced Interconnections Corporation, West Warwick, R.I.

[21] Appl. No.: 552,602

[22] Filed: Nov. 3, 1995

[51] Int. Cl.$^6$ ........................................ H01R 9/09
[52] U.S. Cl. .................................... 439/71; 439/74
[58] Field of Search ......................... 439/70, 71, 66, 439/331, 74, 330

[56] References Cited

U.S. PATENT DOCUMENTS

| | | | |
|---|---|---|---|
| 5,419,710 | 5/1995 | Pfaff | 439/71 |
| 5,518,410 | 5/1996 | Masami | 439/71 |

OTHER PUBLICATIONS

Advanced Interconnections; Ball Grid Array Socketing System, Jun. 1995; pp. 1–4.

Roman, D.; Methode Preps BGA Sockets; EBN, Sep. 11, 1995.

Plastronics Socket Co., Inc., Quaterly Newsletter; SOCK-ETALK, vol. IV; Aug. 1995.

Plastronics Inc. advertisement; Advanced Packaging; Mar./Apr. 1994; p. 42.

E–tec Interconnect Ltd, Lengnau, Switzerland, 2 page brochure.

Lau, J.; Ball Grid Array Technology, Chapter 17, pp. 517–541; 1995.

*Primary Examiner*—Khiem Nguyen
*Assistant Examiner*—Eugene G. Byrd
*Attorney, Agent, or Firm*—Salter & Michaelson

[57] ABSTRACT

A ball grid array socket assembly consists of a socket body having a plurality of vias extending through the socket body between upper and lower surfaces thereof, a plurality of electrically conductive contact assemblies respectively disposed in corresponding vias, and a releasable cover assembly. Each of the contact assemblies includes a lower terminal end projecting outwardly from the lower surface of the body for engaging a terminal pad on a circuit board, and further includes an upper multi-fingered contact arrangement for engaging a ball contact of a ball grid array package. Three separate embodiments of the contact assemblies are disclosed. In use, the ball grid array package is received in assembled relation with the socket body adjacent the upper surface thereof wherein the ball contacts of the ball grid array package are received into the vias in engaging electrical communication with the upper contact ends of the contact assemblies. The multi-fingered upper ends of the contact assemblies engage the BGA ball contact at multiple points to reduce creep associated failure of the contact, while a pivoting contact body portion provides relative movement between the BGA contact ball and the circuit board substrate to reduce thermal expansion stresses. The lower end of the contact assembly may comprise a removable, pivotable post which permits visual inspection of the terminal post solder joint on the terminal pad of the circuit board.

8 Claims, 7 Drawing Sheets

BALL GRID ARRAY SOCKET ASSEMBLY

BACKGROUND AND SUMMARY OF THE INVENTION

The instant invention relates to ball grid array interconnection devices, and more particularly to a low-profile ball grid array (BGA) socket assembly for releasably mounting a ball grid array package to a printed circuit board.

Ball grid array socketing systems have heretofore been known in the art. In this regard, many of the prior art socketing systems include an adapter board which converts the ball grid array package to a pin grid array. More specifically, the ball contacts of the ball grid array package are soldered to a plurality of pins which are arranged in an adapter board. The pins of the adapter board are then inserted into a pin grid array socket to interconnect the ball grid array to the printed circuit board. Direct, or solderless, socket systems are also known in the prior art wherein the ball grid array package is directly received into a socket and retained without soldering of the contact balls. This type of socket enables quick and easy removal, and replacement of the ball grid array package for repair or upgrade without soldering of the ball grid array to an adapter board. However, the known ball grid array socket devices have several disadvantages.

The first disadvantage is that the contact elements of the prior art socket devices include only a focused point of contact for engaging the solder ball. While a gas tight seal between the contact and the solder ball is initially created, it has been found that solder tends to creep over time, i.e. it flows away from the contact, thereby compromising the integrity of the gas tight connection point. Flowing away, or creeping, of the solder ultimately results in corrosion within the solder joint and failure of the connection. Accordingly, there is presently a need for a contact which overcomes the creep problems of the prior art contact means.

The second disadvantage is that the socket terminals of the prior art contact elements are arranged in a rigid array. It has been found that the thermal coefficients of expansion (TCE) of the BGA, the socket, and the underlying circuit board differ significantly. When materials of different TCE's are rigidly bonded together and then heated, the difference of the TCE causes one material to expand more than the other, thereby causing shearing stresses in the rigid joint formed therebetween. Such stress typically results in cracks in the solder joint formed between the BGA ball contact and its land pad on the BGA body, and failure of the joint. Accordingly, there is presently a need for a socketing assembly which overcomes the TCE problem.

The instant invention provides a ball grid array socket assembly which overcomes the stated disadvantages of the prior art. The socket assembly comprises an insulative socket body having a plurality of vias extending through the socket body between upper and lower surfaces thereof, and further comprises a plurality of electrically conductive contact assemblies respectively disposed in corresponding vias. In general, each of the contact assemblies includes a lower terminal end projecting outwardly from the lower surface of the body for engaging a terminal pad on a circuit board, and further includes an upper contact end for engaging a ball contact of a ball grid array package. The ball grid array package is received in assembled relation with the upper surface of the socket body wherein the ball contacts are received into the vias for engagement with the contact assemblies disposed therein. The instant invention overcomes the prior art problems by providing the upper ends of the contact assemblies with multiple engagement points to engage and capture the ball contact of the BGA thereby reducing the creep problems associated with the prior single point contact. Furthermore, the contact assemblies may be provided with a body structure which permits toggling, or pivoting, of the upper and lower contact ends to permit relative movement of the socket and circuit board, and thereby reduce shearing stresses cause by TCE.

More specifically, in a first embodiment of the socket assembly, the contact assembly comprises a conductive pin member having lower terminal end for engaging a terminal pad, and an upper seat end for receiving the bottom portion of the ball contact in seated relation. The contact assembly further includes a multi-fingered contact element received around the upper seat end of the pin member for further engaging the side portions of the ball contact. In a second embodiment of the socket assembly, the contact assembly comprises a conductive pin member having a central body portion, an upper seat end for engaging the bottom portion of the ball contact, and a lower terminal end. The pin member is received in the via with the upper seat end adjacent the upper surface of the socket body. The contact assembly further comprises first and second multi-fingered contact members received around the upper and lower ends of the pin member. The finger portions of the first contact member engage the side portions of the ball contact when the ball contact is seated on the upper contact end of the pin member, while the finger portions of the second contact member engage and capture a bulb end of a terminal post which is soldered to the terminal pad. The combination of the pin member and multi-fingered contacts of the first and second embodiments provide a dual contact assembly which provides better and more reliable contact between the ball contact and the terminal pad. In a third embodiment of the socket assembly, the contact assembly comprises a dual ended contact member and a terminal post. Finger portions on the upper end of the contact member engage the side portions of the ball contact when the ball contact is seated into the via, while finger portions on the lower end of the contact member engage and capture a bulb end of a terminal post which is soldered to the terminal pad.

The second and third embodiments of the socket assembly each further include a positioning membrane disposed adjacent to the lower surface of the socket body wherein the terminal posts extend through, and are captured by, the positioning membrane for positioning the terminal posts for soldering onto the terminal land array.

In use, the respective terminal ends of the contact assemblies are positioned and soldered to the terminal land array of the circuit board. In this regard, the socket body of the second and third embodiments can be removed from the terminal posts for inspection and cleaning of the terminal post solder joints. The ball grid array package is then received in assembled relation with the socket body adjacent the upper surface thereof wherein the ball contacts of the ball grid array package are seated into the vias in engaging electrical communication with the upper contact ends of the contact assemblies. Each of the socket assemblies further includes a retention cover which is releasably mounted to the socket body for releasably retaining the ball grid array package in assembled relation with the socket body. It can thus be appreciated that the socket assembly provides improved electrical communication between the ball contacts and the terminal pads of the circuit board while allowing the ball grid array package to be easily removed for replacement or repair, and allowing relative movement to reduce TCE stresses.

Accordingly, among the objects of the instant invention are: the provision of a ball grid array production socket which has a low profile; the provision of a ball grid array socket which does not require soldering of the BGA ball contacts to establish an electrical connection; the provision of a ball grid array socket assembly requiring a low insertion force; the provision of a ball grid array socket including effective contact assemblies which engage and establish an effective, consistent and reliable electrical connection between the ball grid array contact balls and the terminal pads of the circuit board; the provision of a ball grid array socket assembly which permits relative movement of the upper and lower ends of the contact assemblies; and the provision of a socket assembly which can be disassembled from the soldered terminals for inspection and cleaning of the solder joints.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE PREFERRED EMBODIMENTS

Figure 1:
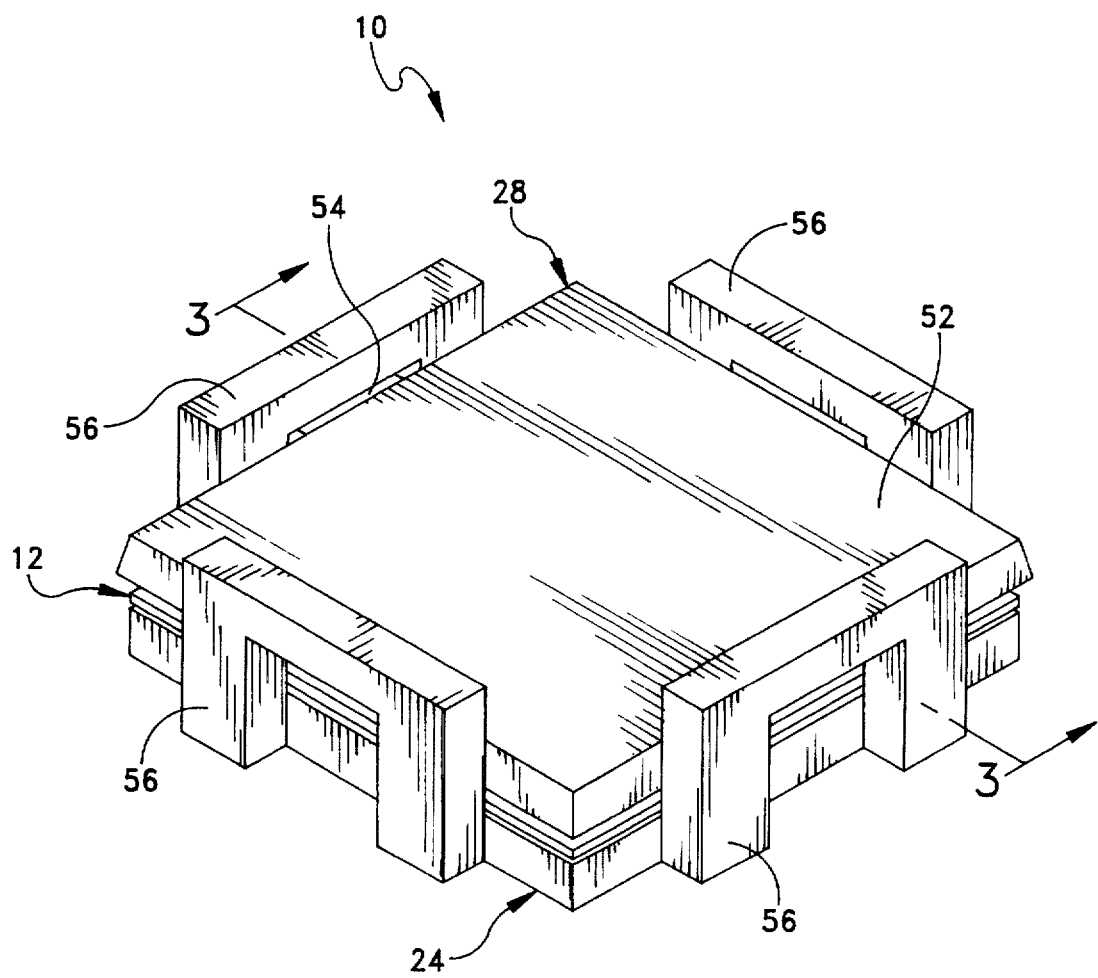
FIG. 1 is a perspective view of the ball grid array socket assembly of the instant invention.
Figure 2:
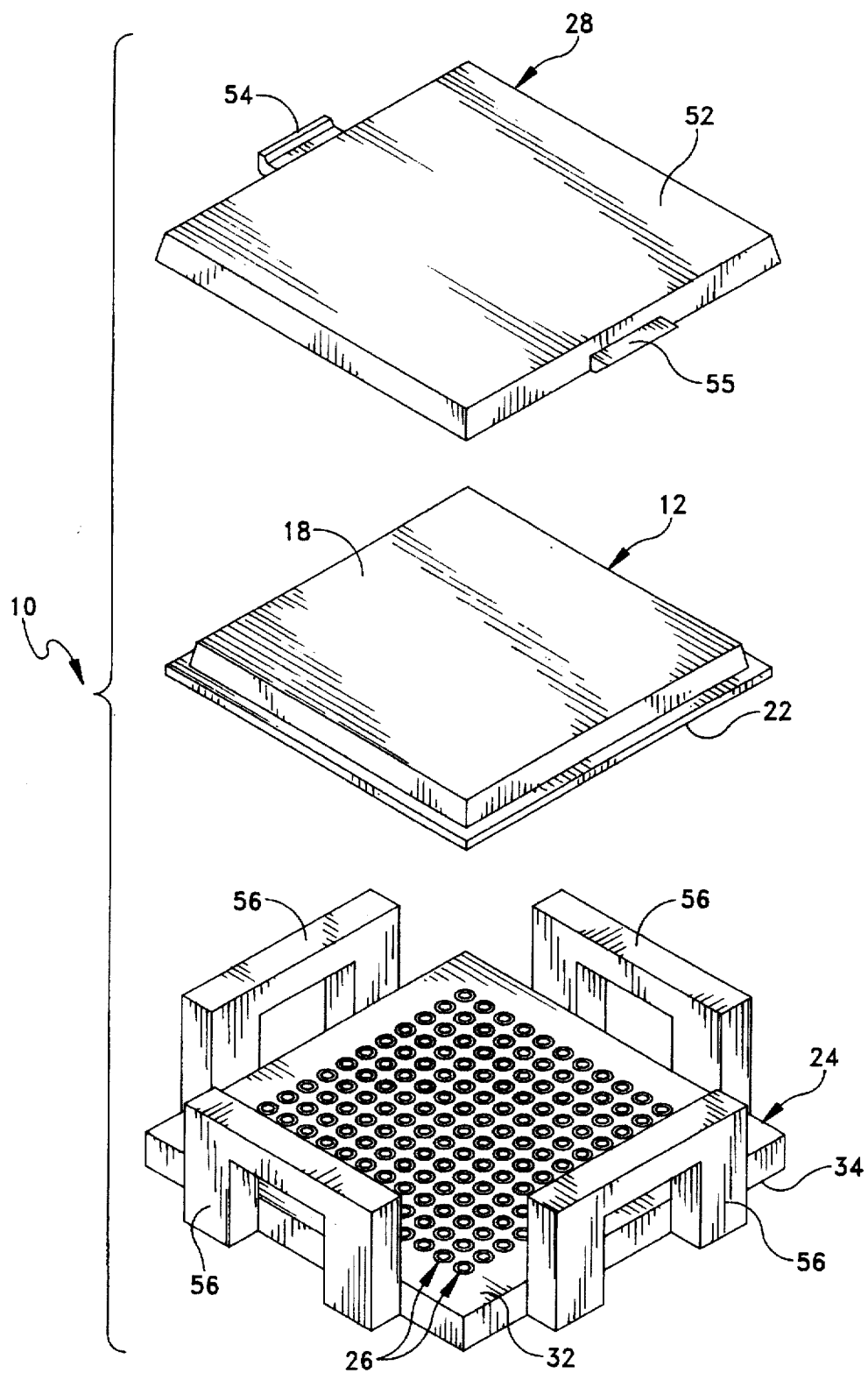
FIG. 2 is an exploded perspective view thereof showing the socket body, ball grid array package, and retention cover.
Figure 3:
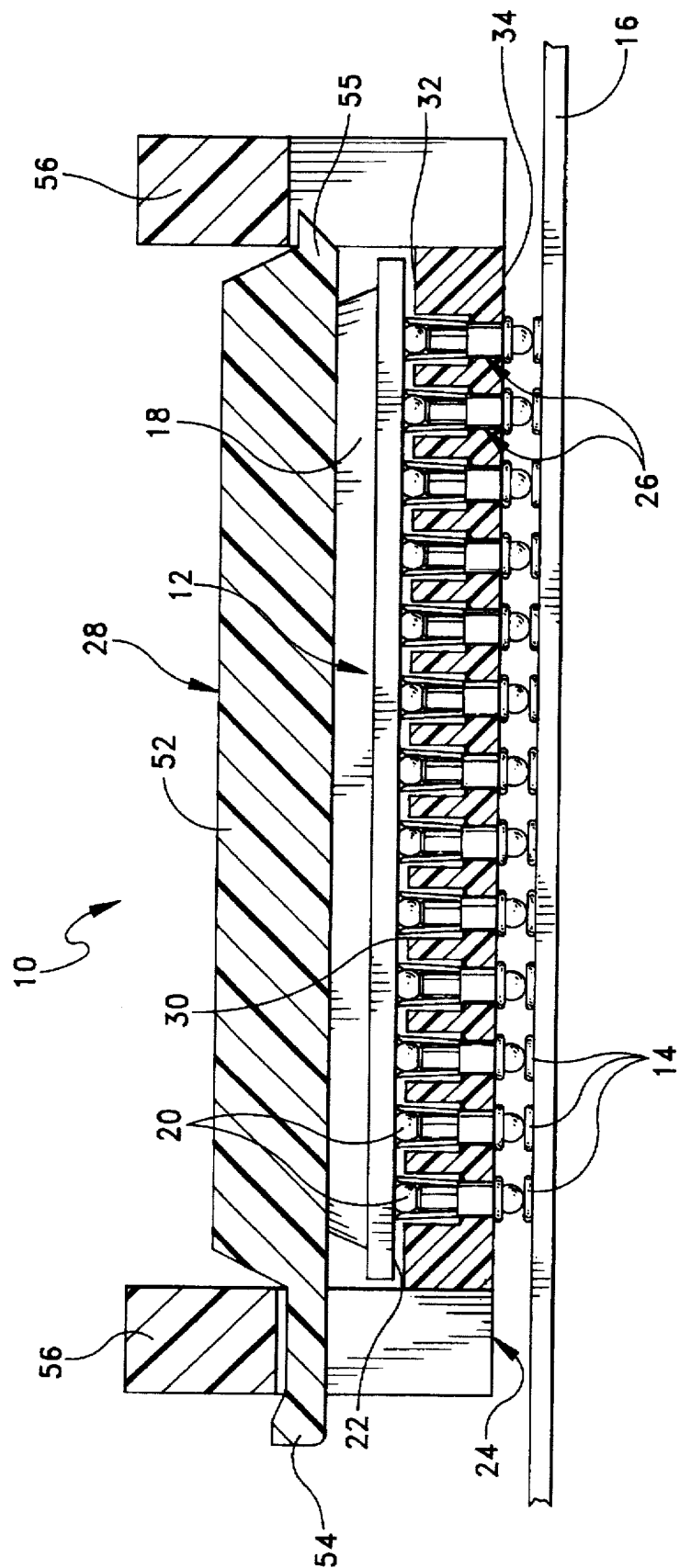
FIG. 3 is a cross-sectional view of the socket assembly taken along line 3—3 of FIG. 1.

Referring now to the drawings, the ball grid array socket assembly of the instant invention is illustrated and generally indicated at 10 in FIGS. 1–3. As will hereinafter be more fully described, the instant ball grid array socket assembly 10 provides a direct, or solderless, socket for interconnecting a ball grid array package generally indicated at 12 with the terminal pads 14 of a printed circuit board 16 (See FIG. 3).

The ball grid array package 12 comprises a body portion 18 which encloses a semiconductor device (not shown), and a plurality of ball contacts 20 disposed on a lower surface 22 of the body 18. The ball contacts 20 typically comprise a solder composition which is normally utilized for direct solder attachment to the terminal pads 14 of a printed circuit board 16.

The socket assembly 10 comprises an electrically insulative, planar socket body generally indicated at 24, a plurality of electrically conductive contact assemblies generally indicated at 26, and a cover plate generally indicated at 28. The socket body 24 is preferably formed from an electrically insulative plastic material, such as a molded glass-filled polyester, or glass epoxy, and includes a plurality of vias 30 extending through the socket body 24 between upper and lower surfaces, 32, and 34 respectively. The vias 30 are arranged in a predetermined footprint corresponding to the particular array of ball contacts 20 on the ball grid array package 12 to be socketed. While the drawings illustrate a square array of ball contacts 20 and vias 30, it is to be understood that the instant socket assembly 10 can be readily modified to accommodate any ball grid array footprint.

Figure 4:
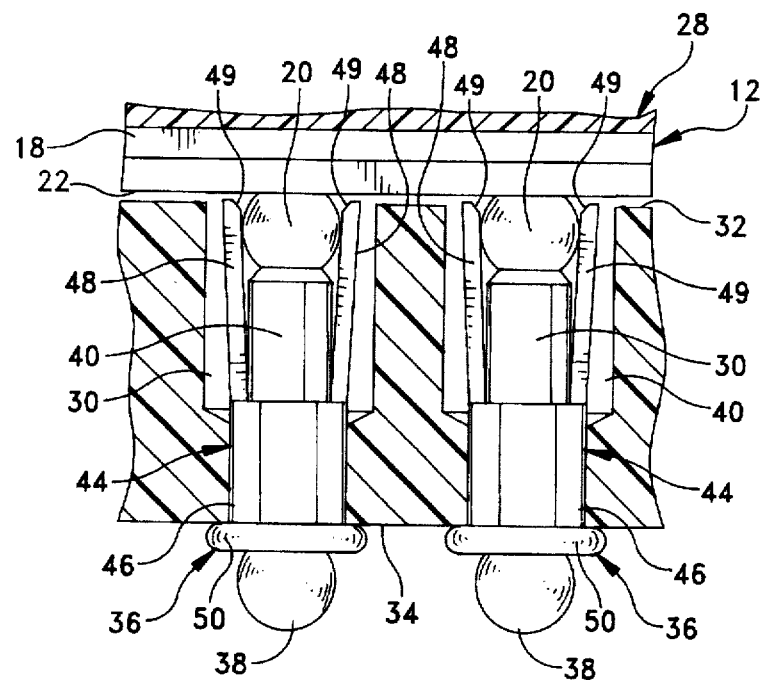
FIG. 4 is an enlarged, fragmentary, cross-sectional view of the socket body illustrating the contact assemblies in detail.
Figure 5:
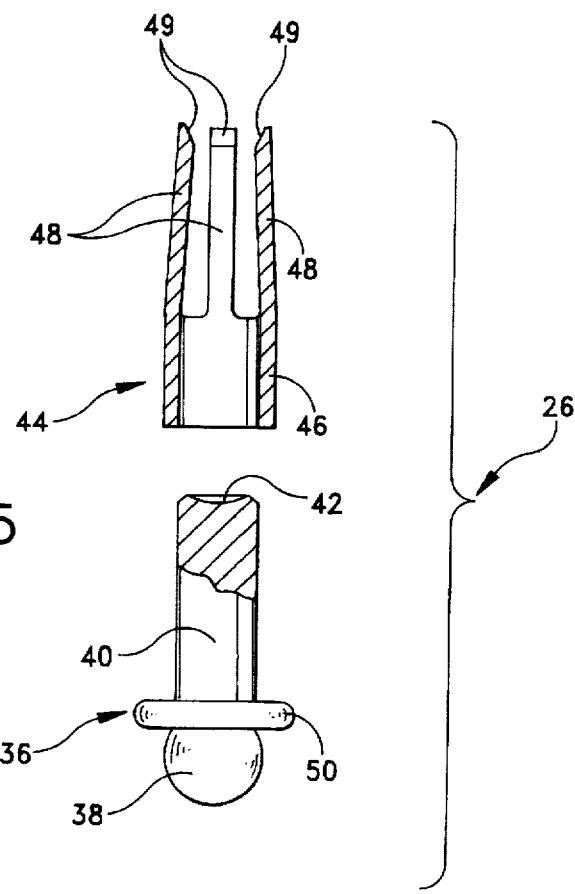
FIG. 5 is an enlarged exploded view of the contact assembly.

The contact assemblies 26 are respectively disposed within the vias 30 and, in general, each contact assembly includes an upper contact end adjacent the upper surface 32 of the socket body 24 for engaging a respective ball contact 20 of the ball grid array 12, and a lower terminal end adjacent the lower surface 34 for engaging a respective terminal pad 14 of the circuit board 16. Referring now to FIGS. 3–5, a first embodiment of the contact assembly 26 is illustrated. The contact assembly 26 comprises a conductive cylindrical pin member generally indicated at 36 having a lower terminal end 38 projecting outwardly from the lower surface 34 of the socket body 24 for engaging the terminal pad 14, and an upper contact end 40 for engaging a bottom portion of the ball contact 20. The pin member 36 is preferably formed from brass, or plated brass, and includes a concave seat 42 at the upper contact end 40 for creating a line of contact around the bottom portion of the ball contact 20.

The contact assembly 26 further comprises a multi-fingered contact member generally indicated at 44 having a generally tubular body portion 46, and a plurality of resilient finger portions 48 which extend upwardly from the body portion 46. The contact members 44 are illustrated as having three fingers, however, the actual number of fingers 48 may be more or less depending on the desired arrangement. The contact member 44 is preferably stamped and formed into a generally cylindrical shape from a thin sheet of conductive metallic material, such as beryllium copper material, and is slidably received around the upper contact end 40 of the pin member 36, wherein the finger portions 48 extend upwardly from the body portion 46 past the upper seat 42 of the pin member 36. The finger portions 48 are formed with a slight inward bend (See FIG. 5) so as to be normally biased for inward movement toward the pin member 36, and are further formed with a chamfer 49 at the terminal end thereof. The assembled pin member 36 and contact member 44 are received in a reduced diameter end portion of the via 30 (See FIG. 4) with the upper contact end 40 of the pin member 36 and the finger portions 48 of the contact member 44 adjacent to the upper surface 32 of the socket body 24. The socket body 24 rests against a shoulder of the pin member 36 formed by a central body portion 50 of the pin member 36. The lower terminal end 38 of the pin member 36 projects downwardly from the socket body 24 for soldering attachment to a terminal land 14 of the circuit board 16 (See FIG. 3).

In use, the ball grid array package 12 is received in assembled relation with the socket body 24 adjacent the upper surface 32, wherein the ball contacts 20 extend downwardly into the top opening of the vias 30 and are received in engagement with upper portion of the contact assembly 26. It is pointed out that the upper opening of the vias 30 are preferably formed with an outward taper or enlarged dimension which is greater than the diameter of the ball contact 20 such that the ball contacts 20 can be at least partially received into the vias 30 with the lower surface 22 of the ball grid array package 12 in closely spaced facing engagement with the upper surface 32 of the socket body 24. A downward pressure is needed to seat the ball contacts 20 into full contact with the contact assembly 26. More specifically, when the ball grid array package 12 is urged downwardly, the bottom portion of the ball contact 20 is received in engagement with the recessed seat 42 of the pin member 36, while the finger portions 48 slidably engage the side portions of the ball contact 20. During seating of the ball contact 20, the finger portions 48 wipe across the surface of the ball contact 20 to establish a good electrical contact. The chamfered ends 49 of the fingers 48 facilitate wiping movement of the fingers 48 across the surface of the ball contact 20 so that they do not gouge or shave the material from the ball contact 20. While the ball contact 20 is seated, the finger portions 48 exert an inward normal force to maintain the contact established during seating thereof. Referring to the prior art contact problems, the contact assemblies 26 provide multiple contact points to insure continuous contact with the ball contact 20. If the multiple fingers 48 of the contact tend to force the solder ball contact 20 to creep inwardly and downwardly, the ball contact is captured from further downward movement by the seat 42 of the terminal pin 36. It is believed that the inward normal force of the fingers will not be sufficient to significantly shear the contact ball 20, and that the solder material of the ball contact will not significantly creep outwardly between the fingers. It can thus be seen that the ball contact 20 is captured on top by the BGA package, on the bottom by the seat 42 of the terminal pin, and on multiple sides by the fingers 48 of the contact thus providing a stable and improved contact arrangement.

The ball grid array package 12 is maintained in assembled relation with the socket body 24 by means of the cover plate 28 which is received in snap-engagement with formations on the socket body 24. The cover plate 28 comprises a planar body 52 having a first tab member 54 projecting outwardly from a first side edge of the cover plate 28, and a second tab 55 extending outwardly from an opposite side edge of the cover plate 28. The tab member 54 is received beneath a U-shaped clip 56 which is integrally formed with the socket body 24 while the second tab 55 is pressed downwardly into engagement with a second clip 56. The terminal end of the second tab 55 is chamfered to facilitate downward movement of the tab 55, and the U-shaped clips 56 are sufficiently resilient so as to be bendable outwardly to enable movement and engagement of the tab 55 beneath the clip 56. The clip attachment means enables quick and easy removal of the cover plate 28 to remove the ball grid array package 12 for replacement or repair, and the clip member 56 further provide a positioning guide for positioning of the ball grid array within the socket 10. While the instant drawings specifically illustrate a retention plate and clip arrangement for releasable mounting of the BGA package 12, it is to be understood that other releasable retention means are also contemplated within the scope of the invention.

Figure 6:
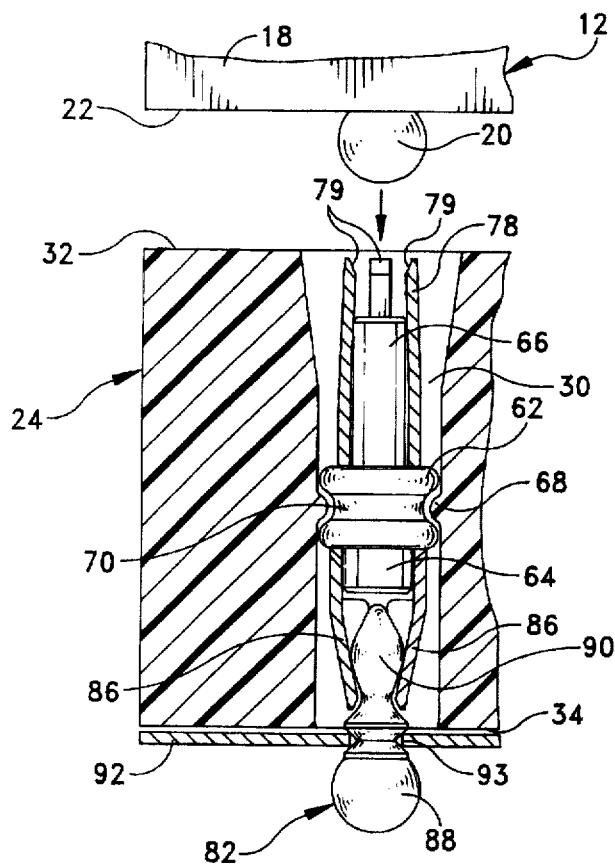
FIG. 6 is an enlarged, fragmentary, cross-sectional view of the socket body illustrating a second embodiment of the contact assembly and further illustrating a ball contact of the ball grid array package positioned above the contact assembly.
Figure 7:
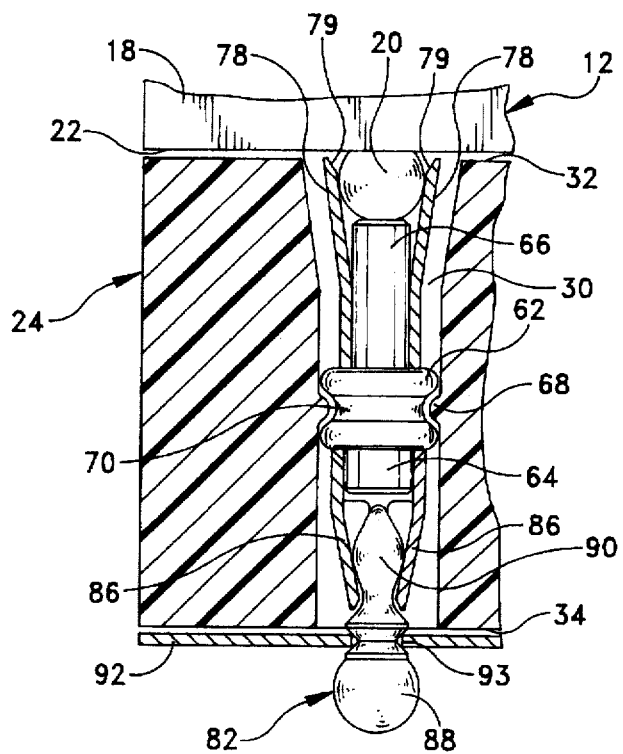
FIG. 7 is a similar view thereof with the ball contact in engagement with the contact assembly.
Figure 8:
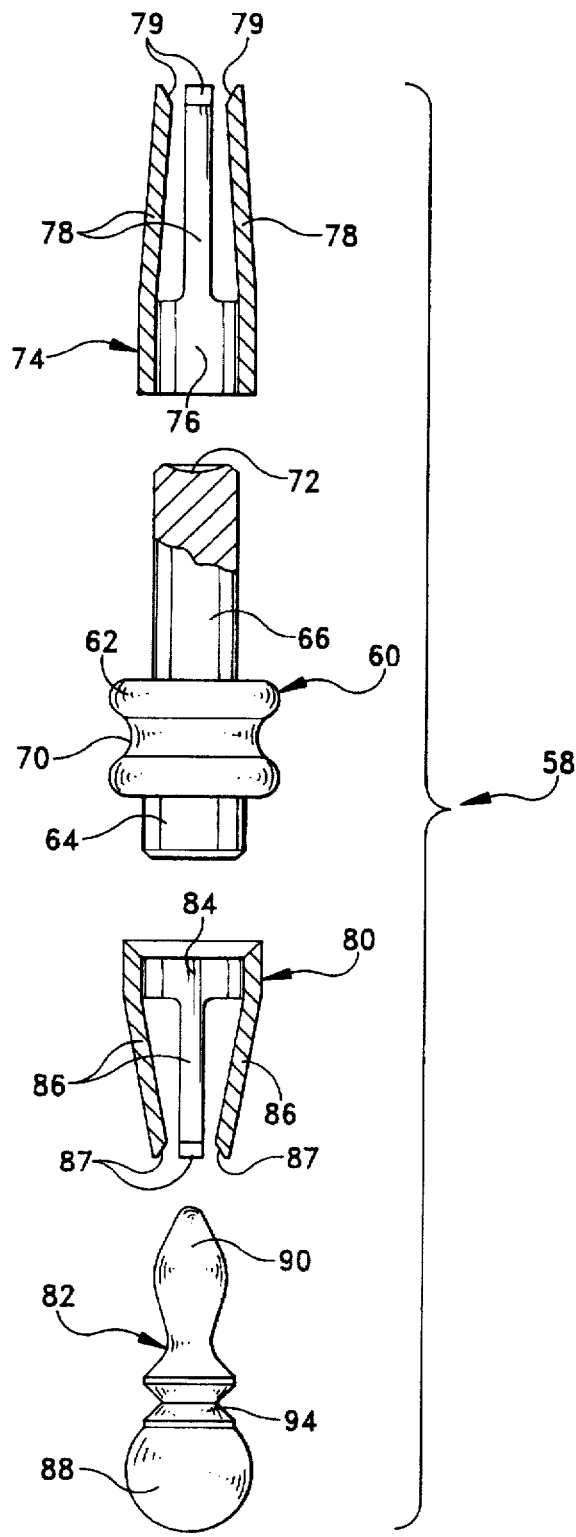
FIG. 8 is an exploded elevational view thereof, with the contact elements shown partially in cross-section.

Turning now to FIGS. 6–8, a second embodiment of the contact assembly is illustrated and generally indicated at 58. The socket body 24 and retention cover 28 are the same as previously described. The contact assembly 58 comprises a conductive pin member generally indicated at 60 having a central body portion 62, a lower terminal end 64, and an upper contact end 66 for engagement with the bottom portion of a ball contact 20. The pin member 60 is positioned within the via 30 with the upper contact end 66 adjacent the upper surface 32 of the socket body 24. The sidewall portion of the via 30, and the central body portion 62 of the pin member 60 include complementary interengaging formations which cooperate to retain the pin member 60 within the via 30, yet permit floating, pivoting movement of the pin member 60 with respect to the body portion 24. More specifically, the sidewall portion of the via 30 includes an inwardly projecting ridge 68 which cooperatively engages with a complementary groove 70 formed in the outer surface of the central body portion 62 of the pin member 60. The pin member 60 preferably includes a concave seat 72 at the upper contact end 66 for creating a line of contact around the bottom portion of the ball contact 20. The contact assembly 58 further comprises a first conductive contact member generally indicated at 74 having a generally tubular body portion 76, and a plurality of resilient finger portions 78 which extend upwardly from the body portion 76. The first contact member 74 is preferably stamped and formed into a generally cylindrical shape from a thin sheet of conductive metal, such as beryllium copper material, and the finger portions 78 are preferably formed with a slight inward bend to provide an inward bias (See FIGS. 6 and 8). The finger portions 78 are further formed with a slight chamfer 79 at the terminal ends thereof. When assembled with the upper contact end 66 of the pin member 60, the finger portions 78 extend upwardly past the upper contact end 66. The contact assembly 58 still further comprises a second contact member generally indicated at 80, and a terminal post generally indicated at 82 which is solderable to the terminal land 14 of the circuit board 16. The second contact member 80 also has a generally tubular body portion 84 which is received around the lower terminal end 64 of the pin member 60, and further includes a plurality of resilient finger portions 86 which extend downwardly from the body portion 84 past the lower terminal end 64 of the pin member 60. The second contact member 80 is also preferably stamped and formed into a generally cylindrical shape from a thin sheet of conductive metal, such as beryllium copper material, and the finger portions 86 are formed with a slight inward bend to provide a normal inward bias (see FIG. 8). The fingers 86 also include a chamfer 87. The terminal post 82 is preferably formed from brass, and comprises a lower ball portion 88, and an upper bulb portion 90. The bulb portion 90 is received in assembled relation into the second contact member 80 (See FIGS. 6 and 7) wherein the finger portions 86 thereof make sliding engagement with side portions of the bulb portion 90. The lower ball portion 88 of the terminal post 82 projects outwardly from the lower surface 34 of the socket body 24 for engagement with a terminal pad 14.

In use, the terminal posts 82 are positioned and soldered onto the terminal lands 14 of the circuit board 16. In this regard, the socket arrangement of the terminal post 82 and finger contact 80 permit removal of the socket body 24 from the circuit board 16 to inspect the solder joints formed between the ball portion 88 of the terminal post 82 and the lands 14 and for cleaning of the posts 82. The socket arrangement of terminal post 82 and contact 80 further provide a means of mechanically attaching the socket to the circuit board 16 without external fastening means. The ball grid array package 12 is then received in assembled relation with the socket body 24 adjacent the upper surface 32 thereof wherein the ball contacts 20 are received at least partially into the vias 30 and are received in engagement with contact assembly 58 (See FIGS. 6 and 7). The fingers 78 and seat 72 make contact with the ball contact 20 as described above with respect to the first assembly 26. As stated above with respect to the first contact assembly embodiment 26, the combination of the pin member 60 and multi-fingered contact 74 of the second embodiment provides a multiple contact and engagement assembly which captures the solder ball contact 20 on all sides and provides a better and more reliable contact between the ball contact 20 and the terminal pad 14. Furthermore, the floating arrangement of the pin 60 provides for toggling or pivoting movement of the terminal post 82 with respect to the socket body 24, and the solder ball contact 20 allowing relative movement of the BGA and the socket caused by TCE mismatch, and thereby reducing any stresses caused by thermal expansion of the BGA 12, the socket 24 or the printed circuit board 16. Accordingly, it can be seen that the second embodiment of the contact assembly as described hereinabove overcomes both of the stated disadvantages of the prior art.

The socket assembly 10 assembly further includes a positioning membrane 92 disposed adjacent to the lower surface 34 of the socket body 24 wherein the terminal posts 82 extend through and are captured by the positioning membrane 92 for positioning the terminal posts 82 for soldering onto the terminal land array. More specifically, grooves 94 on the terminal posts 82 are captured in apertures 93 in the positioning membrane 92 for retention and positioning. Positioning membranes 92 of the type contemplated are known in the art and are more specifically disclosed in U.S. Pat. No. Re 32,540, which is incorporated by reference herein.

Figure 9:
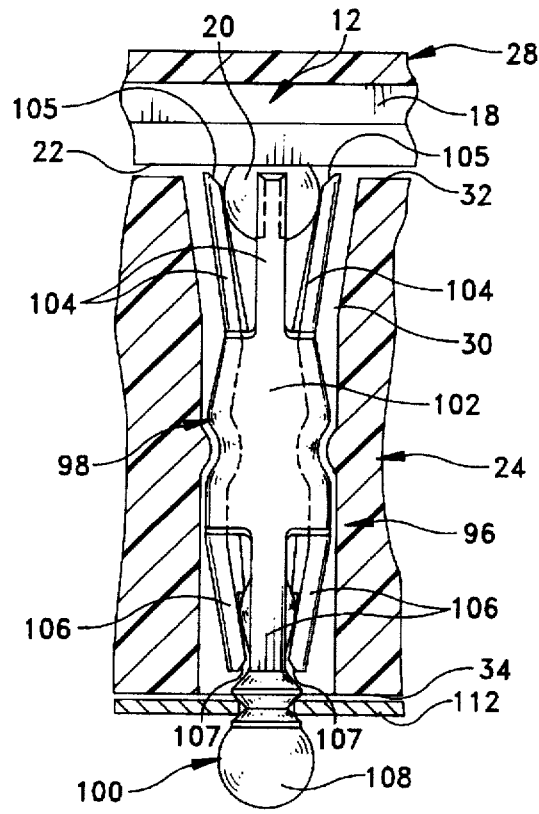
FIG. 9 is an enlarged cross-sectional view of the socket body illustrating a third embodiment of the contact assembly.
Figure 10:
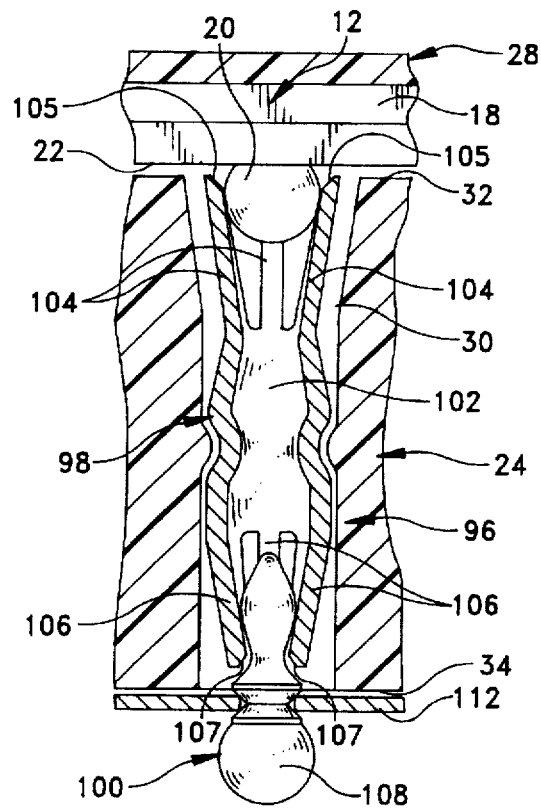
FIG. 10 is a similar view thereof showing the contact body in cross-section.

Referring now to FIGS. 9 and 10, a third embodiment of the contact assembly is illustrated and generally indicated at 96. The socket body 24 and retention cover 28 are as previously described. The contact assembly 96 comprises a dual ended contact member generally indicated at 98, and a terminal post generally indicated at 100. The contact member 98 comprises a generally tubular body portion 102, a first plurality of resilient finger portions 104 which extend upwardly from the body portion 102 and include chamfered 105, and a second plurality of resilient finger portions 106 which extend downwardly from the body portion 102 and include chamfered ends 107. The contact member 98 is preferably stamped and formed in a cylindrical configuration from a sheet of conductive metal, such as beryllium copper material, and both the first and second pluralities of finger portions 104, 106 are formed with a slight inward bend (not shown) to provide an inward bias upon engagement with a respective contact element. The terminal post 100 is formed from brass and comprises a lower ball portion 108, and an upper bulb portion 110 (FIG. 10).

The bulb portion 110 is received in assembled relation into the lower end of the contact member 98 wherein the finger portions 106 make sliding engagement with side portions of the bulb portion 110. The lower ball portion 108 of the terminal post 100 extends downwardly from the lower surface 34 of the socket body 24 for engagement with a terminal pad 14.

In use, the terminal posts 100 are positioned and soldered onto the terminal lands 14 of the circuit board 16. In this regard, the socket arrangement of the terminal post 100 and fingers 106 permit removal of the socket body 24 from the circuit board 16 to inspect the solder joints formed between the ball portion 108 of the terminal post 100 and the lands 14. The ball grid array package 12 is then received in assembled relation with the socket body 24 adjacent the upper surface 22 thereof wherein the ball contacts 20 project downwardly into the vias 30 and are received in engagement with contact assembly 96. The multiple sliding contact points at both ends of this assembly provide highly reliable and effective electrical communication between the contact ball 20 and the terminal pad 14 while also providing effective toggling movement to prevent TCE stresses.

As described with the second embodiment, the assembly further includes a positioning membrane 112 disposed adjacent to the lower surface 34 of the socket body 24 wherein the terminal posts 100 extend through and are captured by the positioning membrane 112 for positioning the terminal posts 100 for soldering onto the terminal land array.

It can therefore be seen that the instant invention provides a unique and effective socket assembly 10 for releasably interconnecting a ball grid array package 12 to a printed circuit board. The low profile socket body 24 and retention cover 28 provide for low profile surface mounting of the socket assembly 10, while the contact assemblies 26, 58, and 96 effectively provide reliable electrical connections between the ball contacts 20 of the ball grid array 12, and the land pads 14 of the circuit board 16. More specifically, the contact assemblies capture the ball contact at multiple points to prevent creep associated failure of the joints, while the unique body structures of the contact assemblies provide relative movement between the BGA ball contact, the socket, and the printed circuit board to reduce TCE related stresses in the solder joints. For these reasons, the instant invention is believed to represent a significant advancement in the art which has substantial commercial merit.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

We claim:

1. A ball grid array socket assembly comprising:

an electrically insulative socket body having upper and lower surfaces and a plurality of vias extending through said socket body between said upper and lower surfaces, said plurality of vias being arranged in a predetermined footprint corresponding to an array of a ball contacts on a bottom surface of a ball grid array package;

a plurality of electrically conductive contact assemblies respectively disposed within corresponding vias, each of said contact assemblies comprising a pin member including an upper end which is disposed within the via, and further including a lower terminal end which projects downwardly from the lower surface of the socket body for engaging another contact, said contact assembly further comprising a contact member having a generally tubular body portion received in close-fitting contact around the upper end of the pin member, and a tubular contact portion which extends upwardly from the body portion past the upper end of the pin member, said tubular contact portion engaging side portions of the ball contacts when a ball grid array package is seated on the upper surface of the socket body; and and retention means for releasably retaining said ball grid array package in assembles relation with said socket body.

2. The ball grid array socket assembly of claim 1 wherein said pin member is generally cylindrical and said contact member has a generally cylindrical body portion and contact portion.

3. The ball grid array socket assembly of claim 1 wherein said contact portion of said contact assembly includes a plurality of spaced resilient fingers having terminal ends which extend upwardly from the body portion past the upper end of the pin member, said terminal ends of said fingers engaging side portions of the ball contacts when a ball grid array package is seated on the upper surface of the socket body.

4. The ball grid array socket assembly of claim 2 wherein said contact portion of said contact assembly includes a plurality of circumferentially spaced resilient fingers having terminal ends which extend upwardly from the body portion past the upper end of the pin member, said terminal ends of said fingers engaging side portions of the ball contacts when a ball grid array package is seated on the upper surface of the socket body.

5. An electrically conductive contact assembly for use in a ball grid array socket assembly comprising:

an electrically conductive pin member including an upper end which is disposed within a via of the socket assembly, and further including a lower terminal end which projects downwardly from a lower surface of the socket assembly for engaging another contact; and a contact member having a generally tubular body portion received in close-fitting contact around the upper end of the pin member, and further having a tubular contact portion which extends upwardly from the body portion past the upper end of the pin member, said tubular contact portion engaging side portions of the ball contacts when a ball grid array package is seated on the upper surface of the socket body.

6. The ball grid array socket assembly of claim 5 wherein said pin member is generally cylindrical and said contact member has a generally cylindrical body portion and contact portion.

7. The ball grid array socket assembly of claim 5 wherein said contact portion of said contact assembly includes a plurality of spaced resilient fingers having terminal ends which extend upwardly from the body portion past the upper end of the pin member, said terminal ends of said fingers engaging side portions of the ball contacts when a ball grid array package is seated on the upper surface of the socket body.

8. The ball grid array socket assembly of claim 6 wherein said contact portion of said contact assembly includes a plurality of circumferentially spaced resilient fingers having terminal ends which extend upwardly from the body portion past the upper end of the pin member, said terminal ends of said fingers engaging side portions of the ball contacts when a ball grid array package is seated on the upper surface of the socket body.

* * * * *